United States Patent
Xia et al.

(10) Patent No.: US 7,550,046 B2
(45) Date of Patent: Jun. 23, 2009

(54) VAPOR DEPOSITION SYSTEM USING BENZOTRIAZOLE (BTA) AND ISOPROPYL ALCOHOL FOR PROTECTING COPPER INTERCONNECTS

(75) Inventors: ChangFeng F. Xia, Plano, TX (US); Arunthathi Sivasothy, Plano, TX (US); Ricky A. Jackson, Richardson, TX (US); Asad M. Hauder, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 42 days.

(21) Appl. No.: 11/901,180

(22) Filed: Sep. 17, 2007

(65) Prior Publication Data
US 2008/0047490 A1    Feb. 28, 2008

Related U.S. Application Data

(62) Division of application No. 11/491,654, filed on Jul. 24, 2006, now abandoned, which is a division of application No. 10/405,590, filed on Apr. 1, 2003, now Pat. No. 7,144,802.

(51) Int. Cl.
*C23C 16/00* (2006.01)

(52) U.S. Cl. .................................................. 118/715
(58) Field of Classification Search ................. 118/715
See application file for complete search history.

(56) References Cited

U.S. PATENT DOCUMENTS

| 3,295,917 | A | * | 1/1967 | Cotton ..................... 427/248.1 |
| 5,395,482 | A | | 3/1995 | Onda et al. .................. 156/646 |
| 5,695,571 | A | | 12/1997 | Watanabe et al. ............... 134/3 |
| 6,350,687 | B1 | | 2/2002 | Avanzino et al. ............ 438/687 |
| 6,464,899 | B1 | | 10/2002 | Haas et al. ................ 252/389.1 |
| 6,551,552 | B1 | | 4/2003 | Lyublinski et al. ............. 422/9 |
| 6,723,631 | B2 | | 4/2004 | Noguchi et al. ............. 438/618 |
| 2001/0020448 | A1 | * | 9/2001 | Vaartstra et al. ............. 118/724 |
| 2001/0055101 | A1 | | 12/2001 | Hayashi ....................... 355/53 |
| 2002/0145210 | A1 | | 10/2002 | Tompkins et al. ........ 261/121.1 |

FOREIGN PATENT DOCUMENTS
JP      402125447 A   *   5/1990

\* cited by examiner

*Primary Examiner*—Evan Pert
(74) *Attorney, Agent, or Firm*—Yingsheng Tung; Wade J. Brady, III; Frederick J. Telecky, Jr.

(57) ABSTRACT

A method of protecting an interconnect is provided. The method includes forming an integrated circuit structure having an interconnect, and depositing vaporized benzotriazole on the interconnect.

7 Claims, 3 Drawing Sheets

VAPOR DEPOSITION SYSTEM USING BENZOTRIAZOLE (BTA) AND ISOPROPYL ALCOHOL FOR PROTECTING COPPER INTERCONNECTS

This is a division of Ser. No. 11/491,654, filed Jul. 24, 2006, now abandoned, which is a division of Ser. No. 10/405,590, filed Apr. 1, 2003, now U.S. Pat. No. 7,144,802.

TECHNICAL FIELD OF THE INVENTION

This invention relates in general to protecting copper interconnects during wafer fabrication, and, more particularly, to vapor deposition of benzotriazole (BTA) for protecting copper interconnects.

BACKGROUND OF THE INVENTION

Integrated circuits often include copper interconnects formed in one or more metalization layers. During wafer fabrication processes to form such integrated circuits, exposed copper interconnects may be oxidized and corroded in humid, chemically or thermally harsh environments, or environments containing oxygen. A film or coating of benzotriazole (BTA) is often applied to exposed surfaces of copper interconnects using wet dipping techniques to prevent oxidation or corrosion of the copper interconnects. The film or coating of BTA is often non-uniform and non-continuous and thus may provide only partial protection of the surfaces of the copper interconnects.

SUMMARY OF THE INVENTION

According to one embodiment, a method of protecting an interconnect is provided. The method includes forming an integrated circuit structure having an interconnect, and depositing vaporized benzotriazole on the interconnect.

According to another embodiment, an integrated circuit structure is provided. The integrated circuit structure includes a first interconnect having a first surface, and a first layer of benzotriazole formed on the first surface of the first interconnect. The first layer of benzotriazole is formed using vapor deposition of benzotriazole on the first surface of the first interconnect.

According to yet another embodiment, a system for protecting an interconnect is provided. The system includes a vapor deposition chamber operable to receive an integrated circuit structure having an interconnect, and to allow vaporized benzotriazole to be deposited on the interconnect.

Various embodiments of the present invention may benefit from numerous advantages. It should be noted that one or more embodiments may benefit from some, none, or all of the advantages discussed below.

One advantage is that since benzotriazole (BTA) exists in single molecules in the vapor state, rather than in clusters of molecules (as in the liquid state), a thin, uniform and continuous film or coating of BTA may be formed on the outer surface of copper interconnects. Such thin, uniform and continuous film or coating of BTA provides enhanced surface protection of the underlying copper interconnects, which is important for producing high-quality wafers.

Another advantage is that by applying BTA in the vapor state, much less BTA may be used as compared with previous wet dipping techniques. Thus, negative environmental effects associated with the use of BTA may be reduced.

Yet another advantage is that applying BTA in the vapor state may reduce the frequency of maintenance for etch stop nitride (NIT) deposition equipment. BTA layers formed by wet dipping are often non-uniform and thus difficult to remove uniformly and completely. As a result, when depositing a nitride etch stop layer adjacent the wafer after removal of the BTA layer, condensation of BTA residue may occur within the nitride deposition chamber, which may require frequent cleaning of the nitride deposition chamber. This may result in down time of the equipment. In contrast, the thin, uniform and continuous BTA layers created by applying BTA in the vapor state are significantly easier to remove uniformly and completely. This may result in less BTA condensation within the nitride deposition chamber, which reduces the required frequency of cleaning the nitride deposition chamber, thus reducing down time of the equipment.

Other advantages will be readily apparent to one having ordinary skill in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE DRAWINGS

Example embodiments of the present invention and their advantages are best understood by referring now to FIGS. 1 through 7 of the drawings, in which like numerals refer to like parts.

Figure 1:
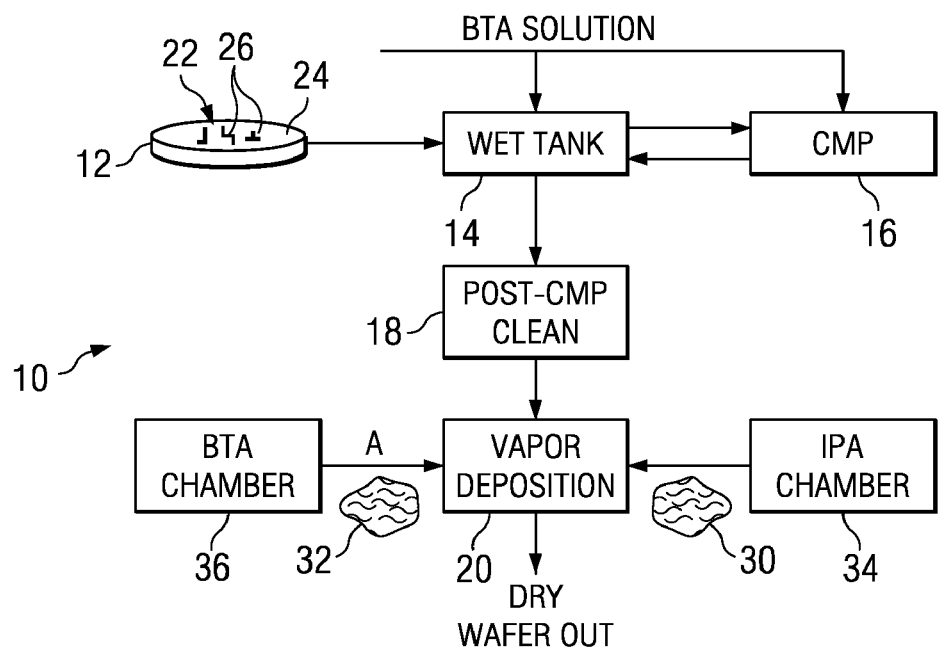
FIG. 1 illustrates a system for polishing, cleaning and depositing benzotriazole (BTA) vapor onto a wafer according to one embodiment of the present invention.

FIG. 1 illustrates a system 10 for polishing, cleaning and depositing vaporized benzotriazole (BTA) onto an integrated circuit structure, or wafer, 12 during the fabrication of the integrated circuit or a component of an integrated circuit according to one embodiment of the present invention. System 10 includes a number of staging areas (such as tanks or chambers, for example) for performing various functions or processes, including a wet tank 14, a chemical mechanical planarization (CMP) chamber 16, a post-CMP clean chamber 18, and one or more vapor deposition chambers 20. Although staging areas 14, 16, 18 and 20 are shown separately in FIG. 1, it should be understood that one or more of such staging areas may be at least partially combined or may be further subdivided.

Wafer 12 may include one or more metalization layers, each comprising one or more low-K dielectric materials and one or more copper interconnects 22. Wafer 12 comprises an outer surface 24 which may be exposed to the surrounding environment during various portions of the fabrication process. Portions of outer surface 24 may comprise outer or exposed surfaces 26 of one or more of the copper interconnects 22. It should be understood that the outer surface 24 of wafer 12 may vary throughout the fabrication process as various fabrication processes are performed and as additional metalization layers are added to wafer 12.

Figure 2:
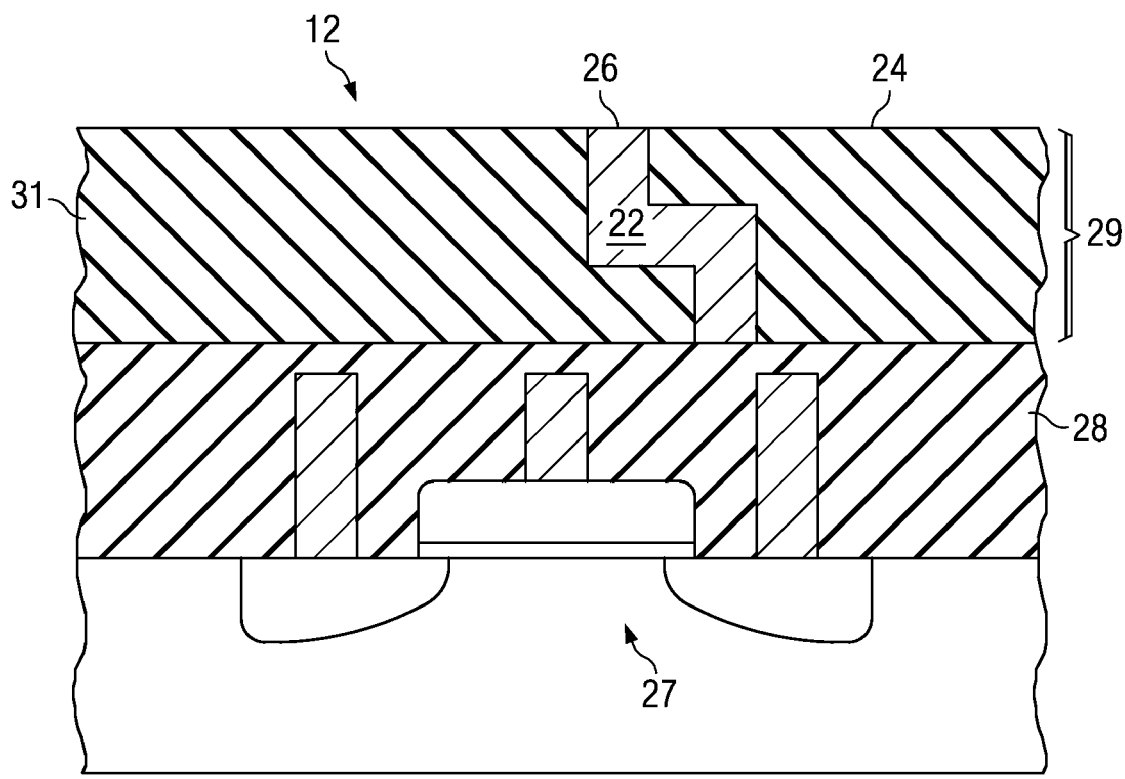
FIG. 2 illustrates an example partial cross-section of a wafer to be processed by the system of FIG. 1.

FIG. 2 illustrates an example cross-section of a portion of wafer 12. Wafer 12 includes a transistor structure 27 covered by a first dielectric material 28, and a first metalization layer 29 comprising a copper interconnect 22 formed in a second dielectric material 31. As discussed above, wafer 12 comprises outer surface 24, a portion of which comprises outer surface 26 of copper interconnect 22.

Returning to FIG. 1, wafer 12 may be received into wet tank 14, which may include liquid, or molten, benzotriazole (BTA) solution. In one embodiment, wet tank 14 includes BTA diluted by de-ionized water. Within wet tank 14, BTA may be applied to the outer surface 24 of wafer 12.

Wafer 12 may proceed to CMP chamber 16, in which a chemical mechanical planarization (CMP) process may be performed to polish the outer surface 24 of wafer 12. BTA solution may be applied to wafer 12 within CMP chamber 16 during at least a portion of the CMP process. Wafer 12 may then proceed back to wet tank 14, in which a new layer of liquid BTA solution may be applied to the outer surface 24 of wafer 12.

Wafer 12 may then proceed to post-CMP clean chamber 18, in which wafer 12 may be cleaned to remove various residue, such as slurry residue and metallic contamination, for example. Such cleaning processes may comprise any of a variety of post-CMP hood clean processes, such as a citric clean (CIT) process, for example.

Wafer 12 may then proceed to one or more vapor deposition chambers 20. In some embodiments, such as the embodiment shown in FIG. 1, a single vapor deposition chamber 20 is used for applying vaporized isopropyl alcohol (IPA) 30 as well as vaporized benzotriazole (BTA) 32 to the outer surface 24 of wafer 12. In one embodiment, IPA vapor 30 and BTA vapor 32 may be applied to wafer 12 simultaneously.

In some embodiments, a low pressure dry (LPD) process using IPA vapor 30 may be performed on wafer 12, with the addition of BTA vapor 32 to the IPA vapor 30. In one such embodiment, vapor deposition chamber 20 comprises a spin dryer.

In the example embodiment shown in FIG. 1, IPA vapor 30 is received into vapor deposition chamber 20 from an IPA chamber 34 and BTA vapor 32 is received into vapor deposition chamber 20 from a BTA chamber 36. IPA chamber 34 may comprise liquid IPA, which is heated to form IPA vapor. The IPA vapor may be carried into vapor deposition chamber 20 by one or more inert carrier gasses, such as Argon, Nitrogen and/or Helium, for example.

Similarly, BTA chamber 36 may comprise liquid BTA, which is heated to form BTA vapor. The BTA vapor may be carried into vapor deposition chamber 20 by one or more inert carrier gasses, such as Argon, Nitrogen and/or Helium, for example. BTA chamber 36 and various systems and methods for producing BTA vapor 32 are discussed in greater detail below with reference to FIG. 3.

Figure 3:
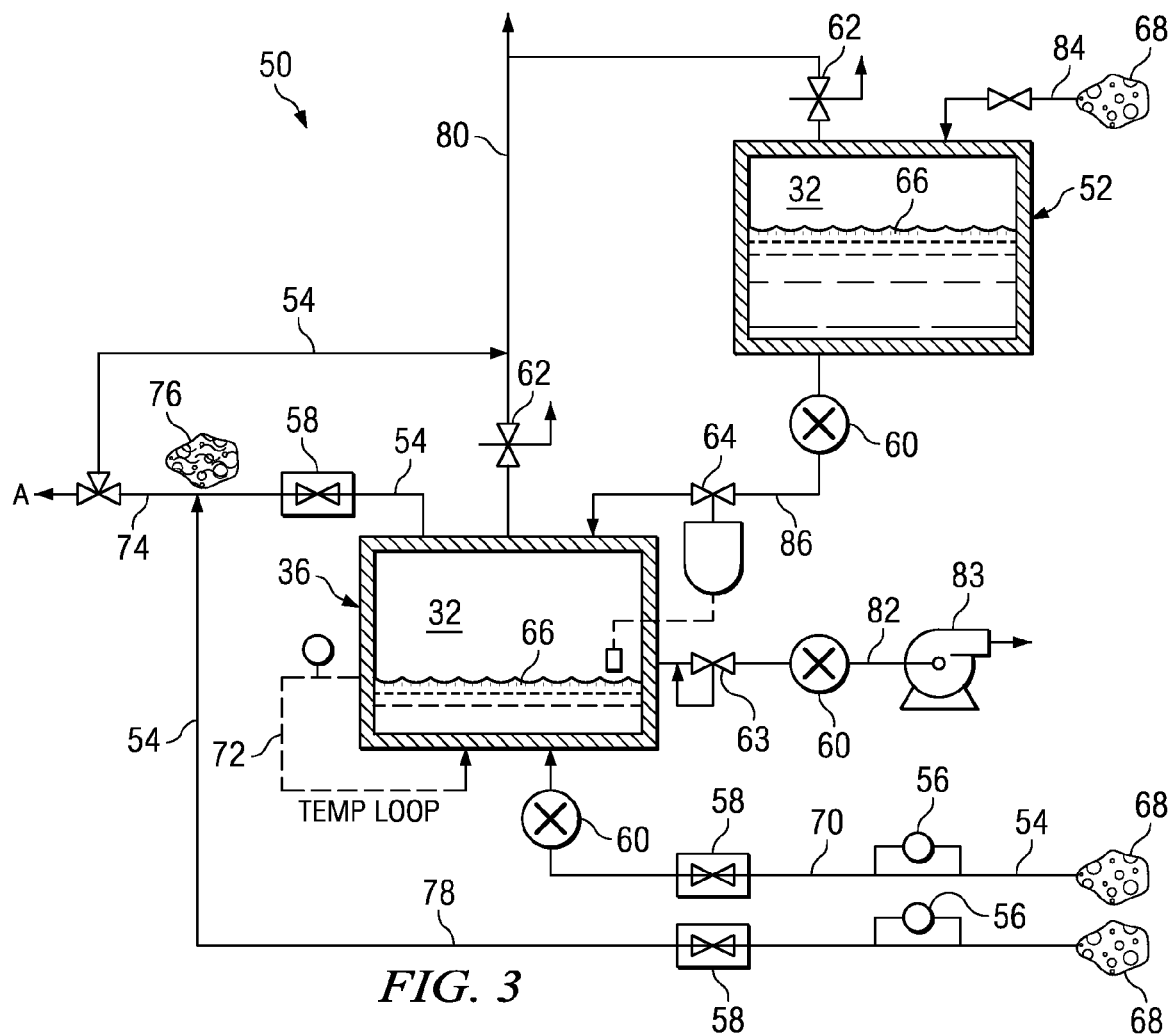
FIG. 3 illustrates an example system for the creation and control of BTA vapor to be delivered into the vapor deposition chamber of the system shown in FIG. 1.

FIG. 3 illustrates a system 50 for the creation and control of BTA vapor 32 to be delivered into vapor deposition chamber 20, as indicated by arrow A in FIG. 1, according to one embodiment of the present invention. System 50 comprises BTA chamber 36, a BTA reservoir 52, gas lines 54, and a number of pressure regulators 56, mass flow controllers 58, irreversible valves 60, pressure relief valves 62, a throttle valve 63 and a control valve 64.

BTA chamber 36 is operable to heat, and thereby vaporize, liquid (molten) BTA 66 to form BTA vapor 32. BTA chamber 36 may include a temperature loop 72 operable to measure and/or control the temperature of liquid BTA 66 within BTA chamber 36, so as to control the rate of vaporization, the concentration of BTA vapor 32 within BTA chamber 36, and/or the pressure within BTA chamber 36. In some embodiments, BTA chamber 36 may be heated to particular temperatures within the range from 50 to 300 degrees Celsius. In one embodiment, the temperature of BTA chamber 36 may be controlled so as to obtain a desired concentration of BTA vapor 32 relative to other gasses within BTA chamber 36.

One or more carrier gasses 68 (such as Argon, Nitrogen and/or Helium, for example) are introduced into BTA chamber 36 via path 70. Carrier gasses 68 may pick up, or entrain, BTA vapor 32 within BTA chamber 36 and carry BTA vapor 32 toward vapor deposition chamber 20 via path 74. In one embodiment, carrier gasses 68 are bubbled through liquid BTA 66 in BTA chamber 36 to pick up, or entrain, BTA vapor 32. The combination of carrier gasses 68 and BTA vapor 32 is indicated in FIG. 3 as combined gasses 76. Additional carrier gasses 68 may be introduced into combined gasses 76 via path 78 in order to dilute or otherwise control the concentration of BTA vapor 32 within combined gasses 76. Combined gasses 76 may continue along path 78 toward vapor deposition chamber 20 (see FIG. 1), as indicated by arrow A in FIG. 3.

Exhaust lines 80 and 82 may be coupled to BTA chamber 36 to allow BTA vapor 32, carrier gasses 68 or combined gasses 76 to escape from BTA chamber 36, so as to control or regulate the temperature or pressure within BTA chamber 36. For example, exhaust lines 80 and/or 82 may be used to obtain a desired concentration of BTA vapor 32 relative to other gasses (such as carrier gasses 68, for example) within BTA chamber 36. As shown in FIG. 1, a pump 83 is coupled to exhaust line 82 to pump vapor or gasses away from BTA chamber 36.

BTA reservoir 52 is operable to store liquid (molten) BTA 66 and/or BTA vapor 32. One or more carrier gasses 68 may be introduced into BTA reservoir 52 via path 84. Carrier gasses 68 may pick up, or entrain, BTA vapor 32 within BTA reservoir 52 to form combined gasses 76 as described above in connection with BTA chamber 36. For example, in one embodiment, carrier gasses 68 are bubbled through liquid BTA 66 in BTA reservoir 52 to pick up, or entrain, BTA vapor 32.

BTA reservoir 52 is coupled to BTA chamber 36 and is operable to communicate liquid BTA 66, BTA vapor 32 and/or combined gasses 76 into BTA chamber 36 via path 86, so as to replenish BTA chamber 36 with liquid BTA 66, or to control or regulate the concentration of BTA vapor 32 within BTA chamber 36, for example. In one embodiment, liquid BTA 66 and or BTA vapor 32 may be communicated between BTA reservoir 52 and BTA chamber 36 in order to obtain a desired concentration of BTA vapor 32 within BTA chamber 36.

Like BTA chamber 36, BTA reservoir 52 may be heated and the temperature controlled in order to control the rate of vaporization, the concentration of BTA vapor 32 within BTA reservoir 52, and/or the pressure within BTA reservoir 52. In some embodiments, BTA reservoir 52 may be heated to particular temperatures within the range from 50 to 300 degrees Celsius.

BTA reservoir 52 may be operable to automatically refill BTA chamber 36 as the liquid BTA 66 and/or BTA vapor 32 within BTA chamber 36 falls below a predetermined level, or to prevent the liquid BTA 66 and/or BTA vapor 32 within BTA chamber 36 from falling below a predetermined level.

In some embodiments, all gas lines 54 and carrier gasses 68 are heated in order to prevent BTA vapor 32 within gas lines 54 from condensing into the liquid phase.

Applying BTA vapor 32 to outer surface 24 of wafer 12, as described above with reference to FIGS. 1 through 3, provides several advantages as compared with applying liquid BTA to outer surface 24. First, the vapor deposition of BTA provides a more continuous and more uniform film of BTA on the exposed surfaces 26 of copper interconnects 22 as compared with applying liquid BTA to wafer 12.

Figure 4:
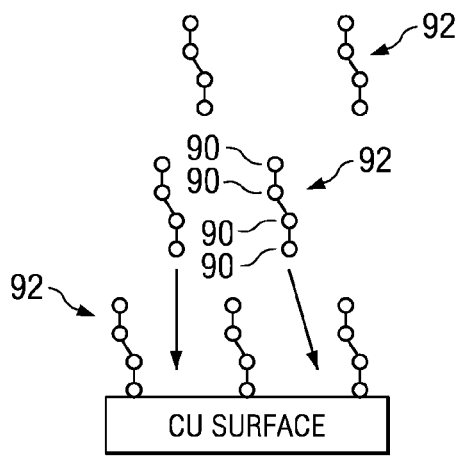
FIG. 4 illustrates application of liquid BTA to a wafer using a traditional "wet dipping" technique.

For example, FIG. 4 illustrates the application of liquid BTA to wafer 12 using a traditional "wet dipping" technique. In the liquid state, BTA molecules 90 naturally form molecule clusters 92. Molecule clusters 92 may attach to an exposed surface 26 of a copper interconnect 22 in a non-uniform and non-continuous manner. In addition, molecule clusters 92 may attach to the exposed surface 26 in such a manner that they block other molecule clusters 92 from attaching to exposed surface 26, thus resulting in portions of exposed surface 26 remaining uncovered by BTA molecules. This can result in a discontinuous and/or non-uniform BTA film.

Figure 5:
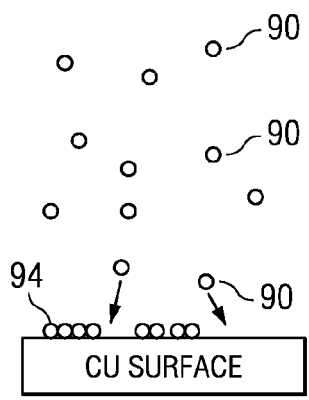
FIG. 5 illustrates vapor deposition of BTA on a wafer according to an embodiment of the present invention.

FIG. 5 illustrates vapor deposition of BTA, or in other words, application of BTA vapor 32, such as described above with reference to FIGS. 1 and 3. As shown in FIG. 5, BTA exists as individual molecules 90 in the vapor state. Thus, when BTA vapor 32 is applied to wafer 12, individual BTA molecules 90 may attach to the exposed surface 26 of a copper interconnect 22, which may result in a thin, uniform and continuous BTA film or coating 94. Such thin, uniform and continuous BTA coating 94 provides enhanced surface protection of copper interconnects 22, which is important for producing high-quality wafers 12 having few defects and little corrosion.

In addition, by applying BTA in the vapor state, much less BTA may be used as compared with previous wet dipping techniques. Thus, any negative environmental effects associated with the use of BTA may be reduced.

Also, applying BTA in the vapor state may reduce the frequency of maintenance for etch stop layer (such as silicon nitride (NIT), silicon carbide, or others, for example) deposition tools. In situations in which an etch stop layer is deposited over the outer surface 24 of wafer 12, the BTA layer or film which was deposited on outer surface 24 must first be removed, such as by using a sputtering process for example. To apply the etch stop layer, wafer 12 is placed in a deposition chamber. If the BTA film was applied using liquid BTA, condensation of BTA or sputtered BTA residue may occur within the nitride deposition chamber during the deposition of the etch stop layer due to the removal of the non-uniform BTA. Such condensate or sputtered residue must be frequently cleaned from the etch stop deposition chamber, which may result in excessive down time of the equipment.

However, the thin, uniform and continuous BTA coating 94 on outer surface 24 created by applying BTA in the vapor state is significantly easier to remove uniformly and completely. This may result in less BTA residue within the nitride deposition chamber, which reduces the required frequency of cleaning the etch stop deposition chamber, thus reducing down time of the equipment.

Figure 6:
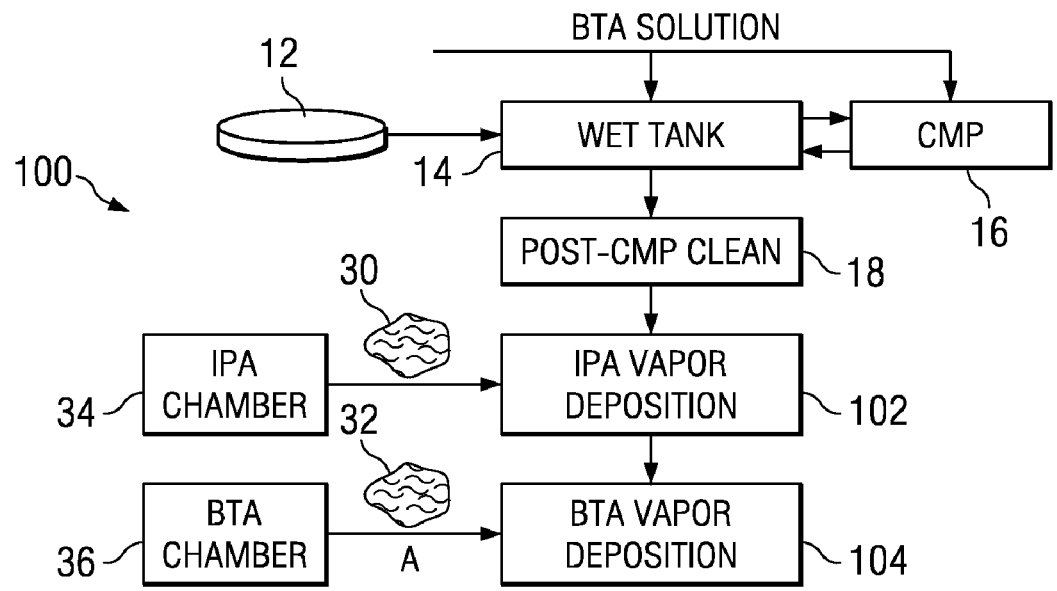
FIG. 6 illustrates a system for polishing, cleaning and depositing BTA vapor onto a wafer according to an alternative embodiment of the present invention.

FIG. 6 illustrates a system 100 for polishing, cleaning and depositing vaporized benzotriazole onto a wafer 12 according to an alternative embodiment of the present invention. System 100 is substantially similar to system 10 shown in FIG. 1; however, system 100 comprises a pair of vapor deposition chambers 20, namely, an IPA vapor deposition chamber 102 for performing the IPA cleaning process and a separate BTA deposition chamber 104 for depositing BTA vapor 32 onto the outer surface 24 of wafer 12. In some embodiments, IPA vapor deposition chamber 102 comprises a low-pressure dryer, or spin dryer.

IPA vapor 30 may be received into IPA vapor deposition chamber 102 from IPA chamber 34. Similarly, BTA vapor 32 may be received into BTA vapor deposition chamber 104 from BTA chamber 36. BTA vapor 32 (or combined gasses 76) may be created, controlled and delivered into BTA vapor deposition chamber 104, as indicated by arrow A in FIG. 3. As discussed above, IPA vapor 30 and/or BTA vapor 32 may be carried into IPA vapor deposition chamber 102 and BTA vapor deposition chamber 104, respectively, using one or more inert carrier gasses, such as Argon, Nitrogen and/or Helium, for example.

Figure 7:
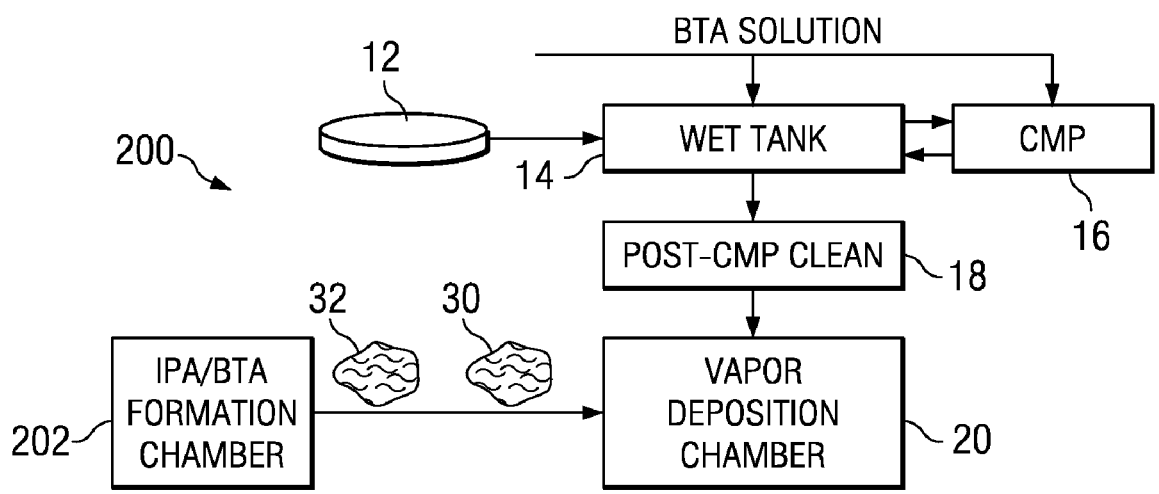
FIG. 7 illustrates a system for polishing, cleaning and depositing BTA vapor onto a wafer according to yet another alternative embodiment of the present invention.

FIG. 7 illustrates a system 200 for polishing, cleaning and depositing benzotriazole vapor onto a wafer 12 according to another alternative embodiment of the present invention. System 200 is substantially similar to systems 10 and 100 shown in FIGS. 1 and 6, respectively; however, the vapor deposition chamber 20 of system 200 receives both IPA vapor 30 and BTA vapor 32 from an IPA/BTA vapor formation chamber 202. As discussed above, IPA vapor 30 and/or BTA vapor 32 may be carried into vapor deposition chamber 20 using one or more inert carrier gasses, such as Argon, Nitrogen and/or Helium, for example.

IPA/BTA vapor formation chamber 202 is operable to produce both IPA vapor 30 and BTA vapor 32 to deliver into vapor deposition chamber 20. In one embodiment, IPA/BTA vapor formation chamber 202 receives and heats liquid IPA and liquid (molten) BTA to form IPA vapor 30 and BTA vapor 32. In another embodiment, IPA/BTA vapor formation chamber 202 comprises heated IPA vapor 30 and/or liquid IPA, receives liquid BTA, and heats the solution to form IPA vapor 30 and BTA vapor 32. In yet another embodiment, IPA/BTA vapor formation chamber 202 comprises heated BTA vapor 32 and/or liquid BTA, receives liquid IPA, and heats the solution to form IPA vapor 30 and BTA vapor 32.

It should be understood that some or all of the systems and methods described above for applying BTA vapor 32 onto the outer surface 24 of wafer 12 may be applied at one or more times and onto one or more outer surfaces 24 during the fabrication of wafer 12. For example, particular wafers may include a plurality of metalization layers having interconnects 22 formed therein, and BTA vapor 32 may be applied to the outer surface of one or more such metalization layers during the fabrication of such wafers. In this manner, surfaces of copper interconnects 22 within various metalization layers which are exposed at particular times during the fabrication process may be protected by a BTA coating 94 formed by applying BTA vapor 32 as discussed above.

Although embodiments of the invention and their advantages are described in detail, a person skilled in the art could make various alterations, additions, and omissions without departing from the spirit and scope of the present invention as defined by the appended claims.

What is claimed is:

1. A system for protecting an interconnect, comprising:
   a vapor deposition chamber for receiving an integrated circuit structure having an interconnect; and
   means for depositing on said interconnect and within said chamber vaporized benzotriazole and isopropyl alcohol.

2. The system of claim 1, further comprising:
   a benzotriazole chamber coupled to said vapor deposition chamber and operable to heat liquid benzotriazole to form said vaporized benzotriazole.

3. The system of claim 2, further comprising:

a benzotriazole reservoir coupled to the benzotriazole chamber, the benzotriazole reservoir operable to store benzotriazole and communicate benzotriazole to the benzotriazole chamber to control the amount of benzotriazole within the benzotriazole chamber.

4. The system of claim 2, wherein:

the benzotriazole chamber is operable to receive an inert carrier gas and allow the inert carrier gas to combine with the vaporized benzotriazole; and the vapor deposition chamber is further operable to apply the combined vaporized benzotriazole and inert carrier gas onto the integrated circuit structure.

5. The system of claim 1, further comprising:

an isopropyl alcohol chamber coupled to said vapor deposition chamber and operable to heat liquid isopropyl alcohol to form said vaporized isopropyl alcohol.

6. The system of claim 5, further comprising:

an isopropyl alcohol reservoir coupled to the isopropyl alcohol chamber, the isopropyl alcohol reservoir operable to store isopropyl alcohol and communicate isopropyl alcohol to the isopropyl alcohol chamber to control the amount of isopropyl alcohol within the isopropyl alcohol chamber.

7. The system of claim 6, wherein:

the isopropyl alcohol chamber is operable to receive an inert carrier gas and allow the inert carrier gas to combine with the vaporized isopropyl alcohol; and the vapor deposition chamber is further operable to apply the combined vaporized isopropyl alcohol and inert carrier gas onto the integrated circuit structure.

* * * * *